(12) United States Patent
Sakai et al.

(10) Patent No.: US 8,704,346 B2
(45) Date of Patent: Apr. 22, 2014

(54) SEMICONDUCTOR PACKAGE AND RADIATION LEAD FRAME

(75) Inventors: Tatsuhiko Sakai, Ohta-ku (JP); Kiyomi Nakamura, Ohta-ku (JP); Yasuo Matsumi, Tsukuba (JP)

(73) Assignee: Sumitomo Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/510,339

(22) PCT Filed: Nov. 16, 2010

(86) PCT No.: PCT/JP2010/070332
§ 371 (c)(1),
(2), (4) Date: Jul. 31, 2012

(87) PCT Pub. No.: WO2011/062148
PCT Pub. Date: May 26, 2011

(65) Prior Publication Data
US 2012/0280375 A1 Nov. 8, 2012

(30) Foreign Application Priority Data

Nov. 19, 2009 (JP) ................................. 2009-263887

(51) Int. Cl.
*H01L 23/495* (2006.01)

(52) U.S. Cl.
USPC ............. 257/674; 257/E23.11; 257/E21.001; 257/E23.051; 257/719; 257/720; 257/721; 257/722; 438/122

(58) Field of Classification Search
USPC ............ 257/719–722, 674, E23.11, E21.001, 257/E23.051; 438/122
See application file for complete search history.

(56) References Cited

U.S. PATENT DOCUMENTS

2008/0210964 A1   9/2008   Tomioka

FOREIGN PATENT DOCUMENTS

| JP | 2002-252373 | A |   | 9/2002 |
|----|-------------|---|---|--------|
| JP | 2002252373  | A | * | 9/2002 |
| JP | 2008-78500  | A |   | 4/2008 |
| JP | 2009-176962 | A |   | 8/2009 |
| JP | 2009176962  | A | * | 8/2009 |

* cited by examiner

*Primary Examiner* — Jerome Jackson, Jr.
*Assistant Examiner* — Bo Fan
(74) *Attorney, Agent, or Firm* — Sughrue Mion, PLLC

(57) ABSTRACT

In a package wherein a lead part coupled to a semiconductor element by wire bonding, an element retention member to retain the semiconductor element on the top face side and radiate heat on the bottom face side, and an insulative partition part to partition the lead part from the element retention member with an insulative resin appear, a creeping route ranging from the top face to retain the semiconductor element to a package bottom face on a boundary plane between the element retention member and an insulative partition part includes a bent route having a plurality of turns. Consequently, it is possible to inhibit an encapsulation resin to seal a region retaining the semiconductor element from exuding toward the bottom face side of the package.

6 Claims, 8 Drawing Sheets

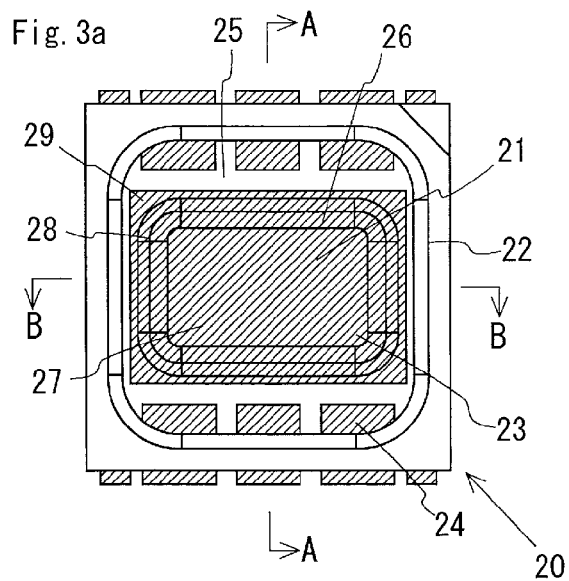
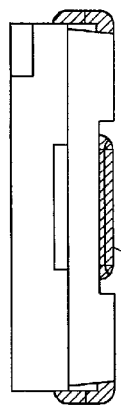
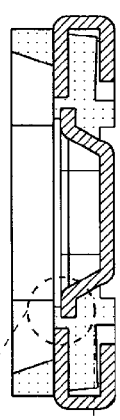
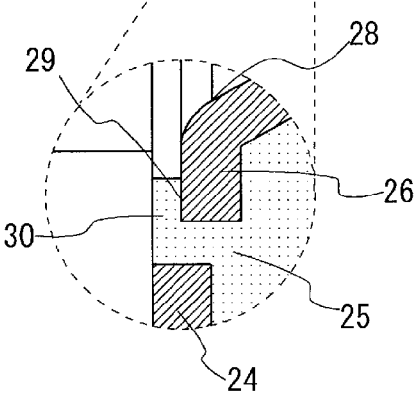
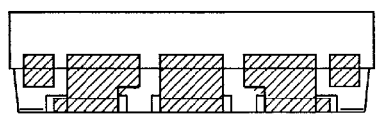
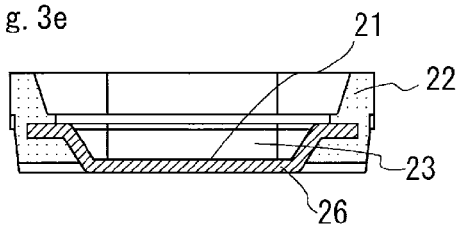
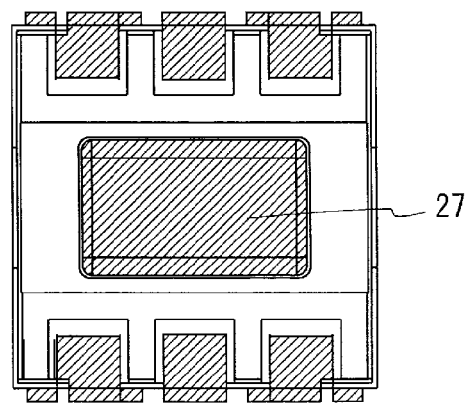
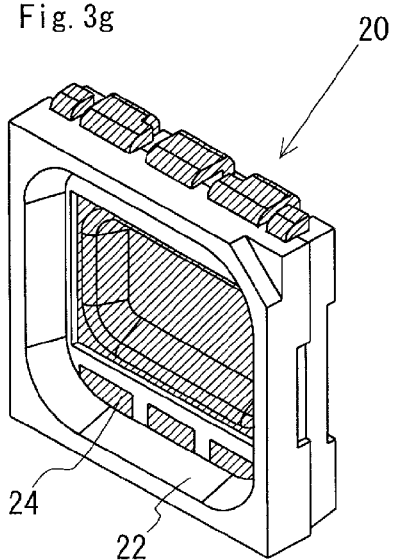

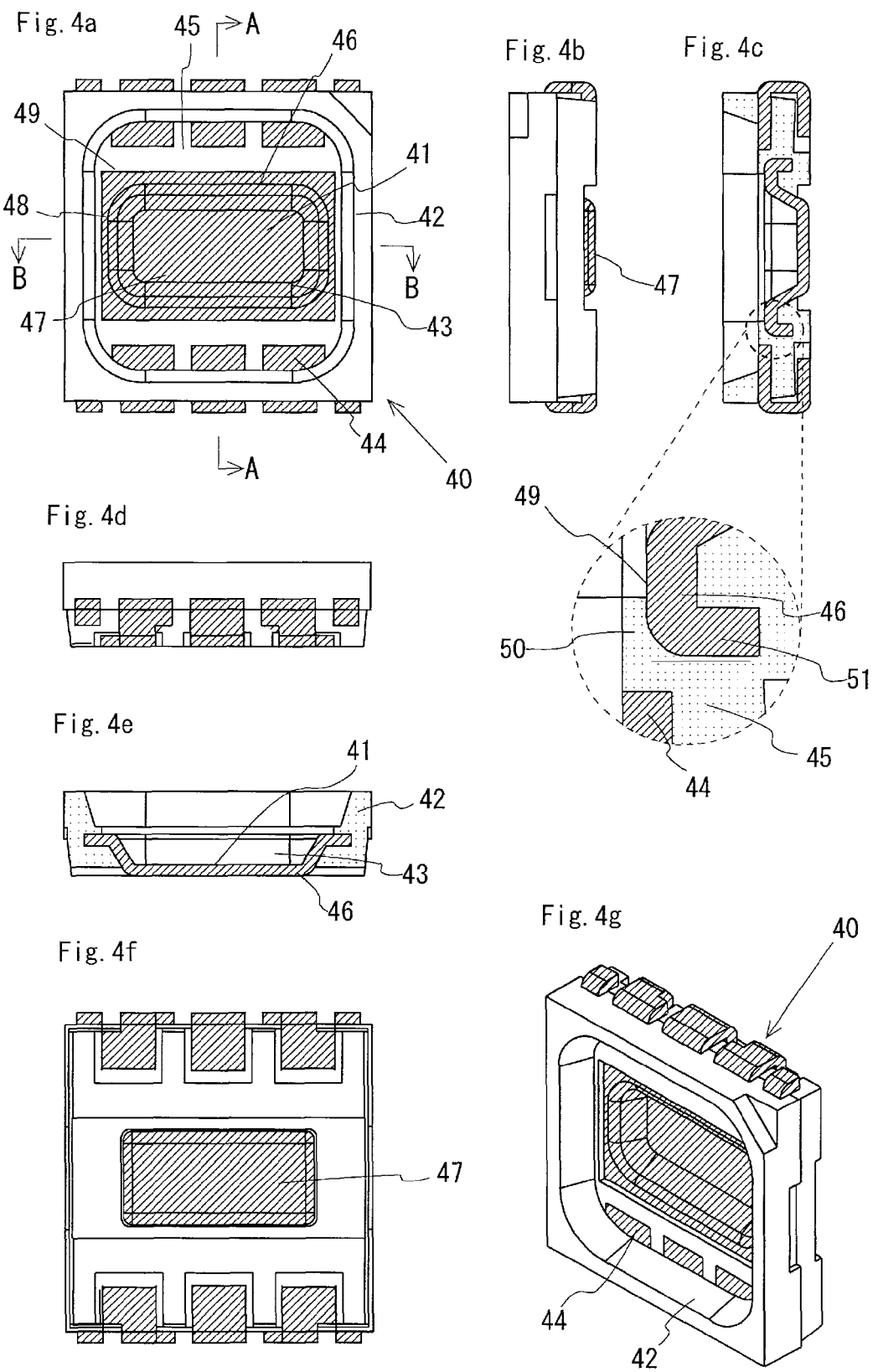

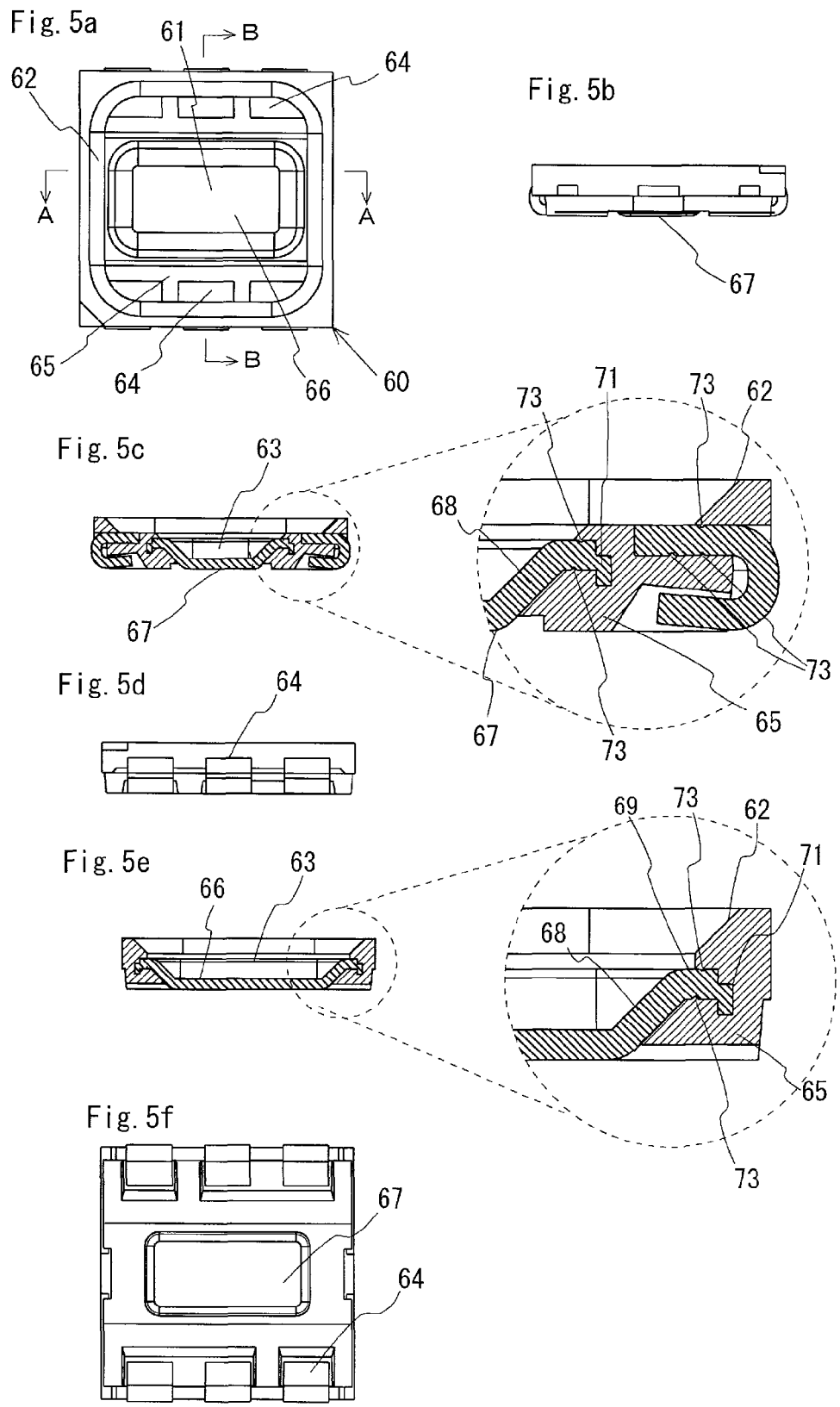

74

Fig. 7a (A) (B)
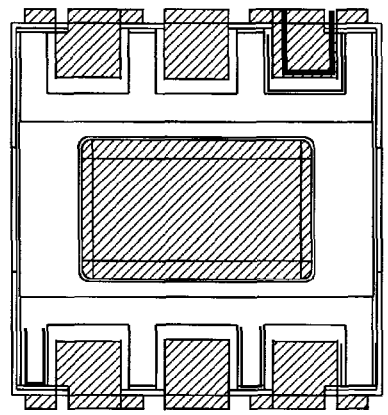
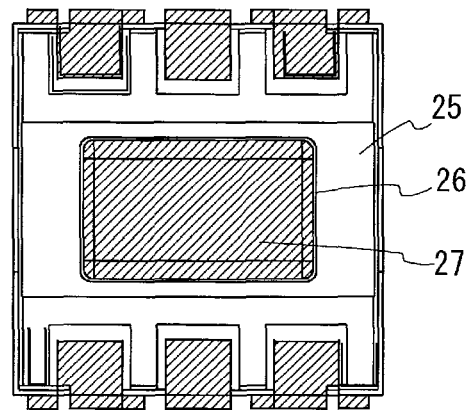
25
26
27
Fig. 7b
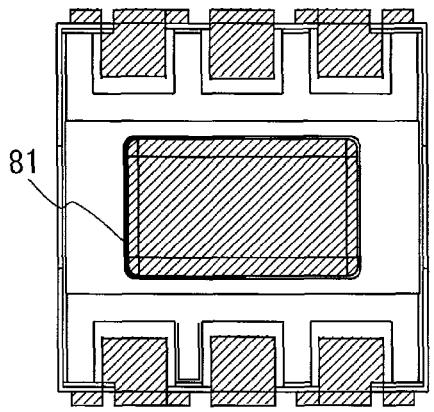
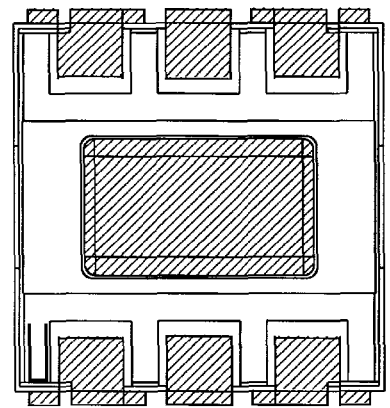
81
Fig. 7c
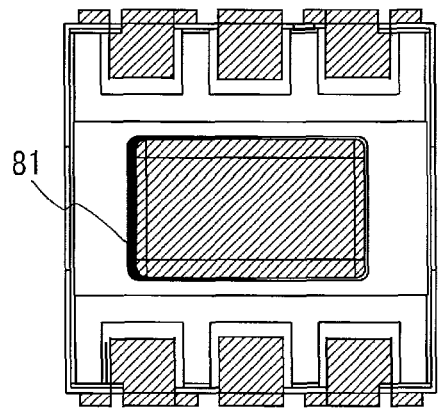
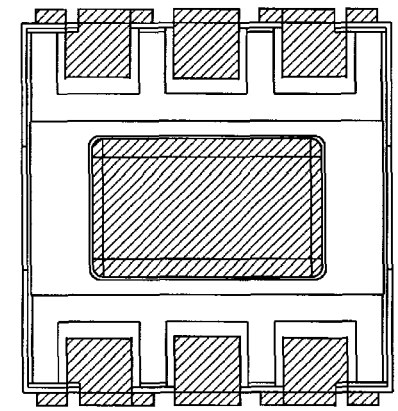
81

Fig. 8d
(A)
(B)
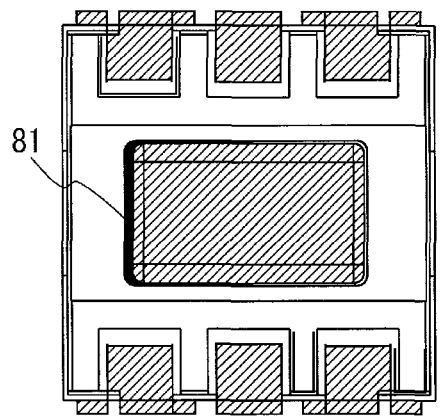
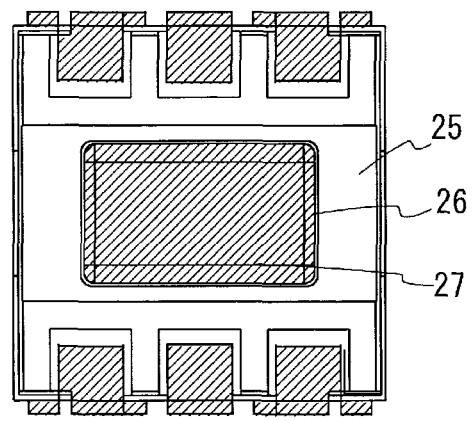
Fig. 8e
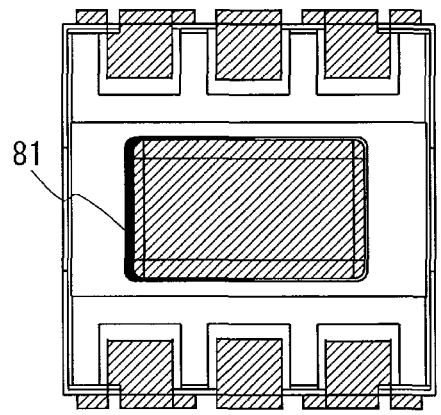
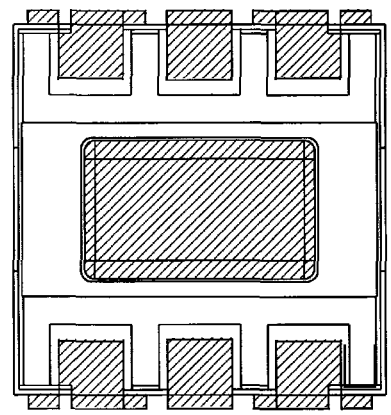
Fig. 8f
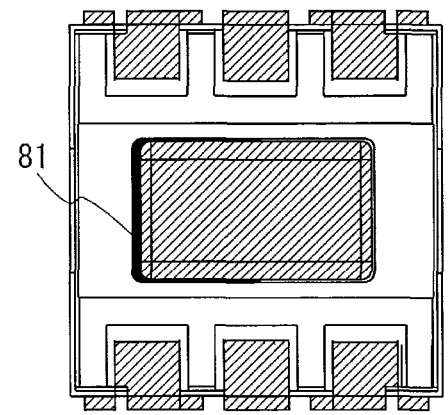
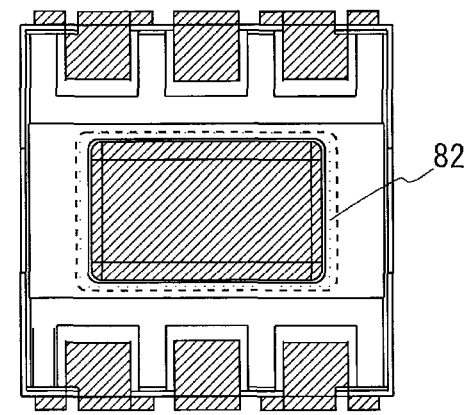

SEMICONDUCTOR PACKAGE AND RADIATION LEAD FRAME

CROSS REFERENCE TO RELATED APPLICATIONS

This application is a National Stage of International Application No. PCT/JP2010/070332 filed Nov. 16, 2010, claiming priority based on Japanese Patent Application No. 2009-263887 filed Nov. 19, 2009, the contents of all of which are incorporated herein by reference in their entirety.

TECHNICAL FIELD

The present invention relates to a semiconductor package that: contains a semiconductor element such as a light-emitting element including an LED, a light intensity sensor, and an image sensor including a CMOS or a CCD; and seals it with an encapsulation resin, an adhesive, or the like. In particular, the present invention relates to: a package that surrounds the circumference of a metallic element retention member to receive and retain a semiconductor element in order to radiate heat with a resin; a package for a semiconductor element that can inhibit an encapsulation resin, an adhesive, or the like in the state of a liquid before solidification from exuding toward the bottom face side of the package when a space where the semiconductor element is contained and retained is sealed; or a semiconductor package that can inhibit flux at soldering and a solvent at cleaning from intruding into the interior of the package for a semiconductor element when the package for a semiconductor element is mounted by soldering on a printed-circuit board or a mounting board having a high heat dissipation. Further, other present invention relates to a radiation lead frame that improves adhesiveness to a resin when a radiation lead frame receiving a semiconductor element and having a heat sink function is integrated with the resin.

BACKGROUND ART

A light emitting diode (referred to as "LED") device as a kind of a semiconductor element is a lighting apparatus attracting attention as one of the so-called "energy-saving" home appliances and is used as a backlight of a liquid crystal display as well as an ordinary lighting apparatus because the electric power consumption is low and generated heat is small in comparison with an incandescent lamp for example. Although the generated heat is far smaller than that of an incandescent lamp, large electric current flows in an LED element of a high output (high intensity) type and hence heat generation and temperature rise of non-negligible levels are caused in some cases.

In view of the situation, the present applicants have already proposed a package for an LED device that improves heat dissipation and has a small thickness (refer to Patent Literature 1). The package for an LED device is a package for an LED device that: has an LED retention plane including a region for retaining an LED element and a frame member to surround the circumference of the LED retention plane; and seals an element retention space formed with the LED retention plane and the frame member with an optically transparent resin. On the LED retention plane, a cup-shaped member to retain an LED element, a lead part, and an insulative partition part to partition the cup-shaped member and the lead part from each other appear.

In such a package for an LED device in particular, a good heat dissipation effect can be obtained by making the bottom face of a bottom plate part in a cup-shaped member appear on a plane identical to the bottom face of an insulative partition part on the bottom face side of the package for the LED device and thus making electrically conductive parts of external radiation member and heat sink for cooling and a printed-circuit board stick tightly to the bottom face of the LED device in order to improve heat dissipation.

Further, in other semiconductor elements such as image sensors including a CMOS and a CCD, heat is generated during operation though the quantity is small and noises caused by the heat increase in some cases. Consequently, a heat dissipation mechanism is important also in a package on which an image sensor is mounted in some cases.

PREVIOUS TECHNICAL LITERATURE

Patent Literature

Patent Literature 1: JP-A No. 2009-224411

DISCLOSURE OF THE INVENTION

Problem to be Solved by the Invention

Meanwhile, in the processes of manufacturing an LED device or an image sensor device with a package for an LED or an image sensor, since a package structure is heated in a process of mounting a semiconductor element on an element retention member to retain the semiconductor element and a wire bonding process of bonding the mounted semiconductor element to a lead part, a gap is formed on a boundary plane between the metallic element retention member to retain the semiconductor element and radiate heat and a insulative partition part, and a problem arising during the succeeding process of sealing an element retention space and the circumference of a semiconductor with an optically transparent resin or an optically nontransparent resin is that an encapsulation resin in the state of a liquid before solidification exudes on the bottom face side of a package, solidifies on the bottom face side, and causes burrs to be generated in some cases.

In the case of making the bottom face of the bottom plate part of an element retention member appear on a plane identical to the bottom face of an insulative partition part on the bottom face side of a package in a semiconductor device as a radiating plane in order to improve heat dissipation in particular, if a liquid encapsulation resin exuding toward a package bottom face side solidifies, burrs are formed around the radiating plane on the bottom face side and the heat dissipation effect of the semiconductor device itself is likely to be hindered considerably.

Meanwhile, in a lead frame, when a lead frame unites with a resin, it is important to improve adhesiveness between the metallic lead frame and the resin. In the case of mounting a semiconductor element on a lead frame and sealing them with a resin for example, if the adhesiveness between the lead frame and the resin is poor, water vapor, oxygen, or another gas reaches the semiconductor element in the interior of the encapsulation resin with the lapse of time and adversely influences the semiconductor element in some cases.

An object of the present invention is to inhibit an encapsulation resin to seal a region retaining a semiconductor element such as an LED from exuding toward the bottom face side of a package. Further, another object of the present invention is to obtain a radiation lead frame that can improve the adhesiveness to a resin when a semiconductor element is mounted and integrated with the resin.

Means for Solving the Problem

A semiconductor package according to the invention described in Claim 1 is a package: the package having a semiconductor element retention plane including a region for retaining a semiconductor element and a frame member surrounding the circumference of the semiconductor element retention plane and being used for configuring a semiconductor device formed by sealing an element retention space formed with the semiconductor element retention plane and the frame member with an optically transparent resin or an optically nontransparent resin; and a lead part electrically coupled to the semiconductor element by wire bonding, an element retention member to retain the semiconductor element on the top face side and radiate heat from the semiconductor element on the bottom face side, and an insulative partition part to partition the lead part from the element retention member with an insulative resin appearing on the semiconductor element retention plane, wherein a creeping route ranging from the top face to retain the semiconductor element to a package bottom face on a boundary plane between the element retention member and the insulative partition part includes a bent route having a plurality of turns.

A semiconductor package according to the invention described in Claim 2 is a package wherein the creeping route described in Claim 1 includes a bent route having three or more turns.

A semiconductor package according to the invention described in Claim 3 is a package wherein one of the bent routes described in Claim 1 or 2 is formed with an overlap part extending inside the periphery of the element retention member so as to cover the boundary plane with the element retention member from the insulative partition part on the top face.

A semiconductor package according to the invention described in Claim 4 is a package wherein the bent route described in any one of Claims 1 to 3 is formed with a bent part at the brim part of the element retention member.

A semiconductor package according to the invention described in Claim 5 is a package wherein the bent route described in any one of Claims 1 to 3 is formed with a notched part at the brim part of the element retention member.

A semiconductor package according to the invention described in Claim 6 is a package wherein the bent route described in any one of Claims 1 to 3 is formed with a stepped part at the brim part of the element retention member.

A semiconductor package according to the invention described in Claim 7 is a package wherein the stepped part described in Claim 6 is formed by coining the element retention member by press.

A semiconductor package according to the invention described in Claim 8 is a package wherein the semiconductor element described in any one of Claims 1 to 7 is an element selected from the group of a light emitting diode, a light intensity sensor, a CMOS image sensor, and a CCD image sensor.

A lead frame according to the invention described in Claim 9 is a lead frame having an element retention member to retain a semiconductor element on the top face side and radiate heat from the semiconductor element on the bottom face side, at least one lead part disposed outside the element retention member and electrically coupled to the semiconductor element by wire bonding, a hoop frame material disposed outside the element retention member and a lead member, and a connecting piece to connect the element retention member or the lead part to the hoop frame material, wherein at least any one of a bent part, a notched part, and a stepped part is formed at the periphery other than the connecting piece of the element retention member.

Effect of the Invention

The present invention has the effect of at least inhibiting an encapsulation resin to seal a region retaining a semiconductor element from exuding toward the bottom face side of a package in a liquid state before solidification and causing burrs. Another present invention has the effect of improving adhesiveness to a resin when a radiation lead frame receiving a semiconductor element and having a heat sink function is integrated with the resin.

BRIEF DESCRIPTION OF THE DRAWINGS

FIG. 3 comprises explanatory views showing a configuration of an example of a semiconductor package according to the present invention; FIG. 3A is a plan view, FIG. 3B a side view, FIG. 3C a sectional view taken on line A-A, FIG. 3D a front view, FIG. 3E a sectional view taken on line B-B, FIG. 3F a rear view, and FIG. 3G a perspective view.

FIG. 4 comprises explanatory views showing a configuration of another example of a semiconductor package according to the present invention; FIG. 4A is a plan view, FIG. 4B a side view, FIG. 4C a sectional view taken on line A-A, FIG. 4D a front view, FIG. 4E a sectional view taken on line B-B, FIG. 4F a rear view, and FIG. 4G a perspective view.

FIG. 5 comprises explanatory views showing a configuration of yet another example of a semiconductor package according to the present invention; FIG. 5A is a plan view, FIG. 5B a side view, FIG. 5C a sectional view taken on line B-B and a partially enlarged view thereof, FIG. 5D a front view, FIG. 5E a sectional view taken on line A-A and a partially enlarged view thereof, and FIG. 5F a bottom view.

FIG. 7 comprises explanatory views schematically showing the results of permeation test with a semiconductor package shown in FIG. 3.

FIG. 8 comprises explanatory views schematically showing the results of permeation test with a semiconductor package shown in FIG. 3.

BEST MODE FOR CARRYING OUT THE INVENTION

Figure 1A:
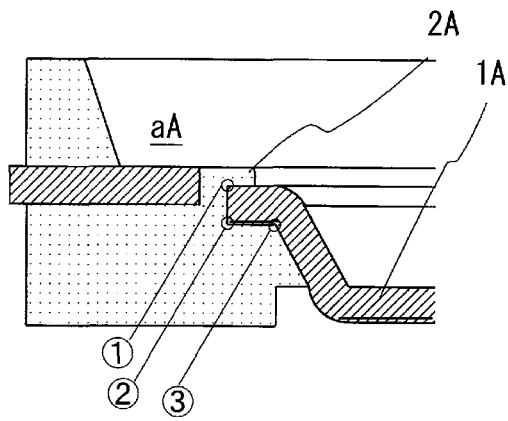
FIG. 1A represents the case of an overlap part, FIG. 1B the case of a notched part, FIGS. 1C and 1D bent parts, and FIGS. 1E and 1F stepped parts.

The present invention is a semiconductor package having a lead part electrically coupled to a semiconductor element by wire bonding, an element retention member to retain the semiconductor element on the top face side and radiate heat from the semiconductor element on the bottom face side, and an insulative partition part to partition the lead part from the element retention member with an insulative resin appearing on the semiconductor element retention plane including a region for retaining the semiconductor element, wherein a creeping route ranging from the top face to retain the semiconductor element to a package bottom face on a boundary plane between the element retention member and the insulative partition part includes a bent route having a plurality of turns, and hence an encapsulation resin is inhibited at least from exuding toward the bottom face side of the package in a liquid state before solidification and causing burrs.

A semiconductor package according to the present invention is a package having a semiconductor element retention plane including a region for retaining a semiconductor element and a frame member surrounding the circumference of the semiconductor element retention plane and being used for configuring a semiconductor device formed by sealing an element retention space formed with the semiconductor element retention plane and the frame member with an optically transparent resin or an optically nontransparent resin, wherein a lead part electrically coupled to the semiconductor element by wire bonding, an element retention member to retain the semiconductor element on the top face side and radiate heat from the semiconductor element on the bottom face side, and an insulative partition part to partition the lead part from the element retention member with an insulative resin appear on the semiconductor element retention plane constituting the bottom face of the element retention space sealed with the optically transparent resin or the optically nontransparent resin.

Consequently, when a semiconductor element is mounted, through at least two heating and cooling processes of mounting the semiconductor element on an element retention member and wire bonding between the semiconductor element and a lead part, a gap may undesirably be formed between the element retention member or the lead part and an insulative partition part because temperature cycles are applied, a liquid encapsulation resin before solidification intrudes into the gap, and not only that influences the appearance of a product largely but also various adverse effects are caused. Further, such function is seen similarly in soldering by reflow and cleaning operation.

In a semiconductor package wherein the bottom face of the bottom plate part of an element retention member to retain a semiconductor element appears on a plane identical to the bottom face of an insulative partition part in order to improve heat dissipation for example, it is concerned that, when a liquid encapsulation resin before solidification exudes toward the bottom face side of the package, then solidifies, and covers a part or the whole of the bottom face of the bottom face part of the element retention member, it comes to be impossible to tightly attach and solder the electrically conductive body part of external radiation member and heat sink and a printed-circuit board to the bottom face of the semiconductor package and heat dissipation effect is hindered considerably. Further, at a lead part, it is concerned that a liquid encapsulation resin exudes outside a semiconductor package and solidifies, the encapsulation resin solidified during wiring hinders, and a sufficient wiring strength is not obtained or wire breakage occurs. Further, when it is mounted on a printed-circuit board or the like, it is also concerned that a mounting angle changes and a light-emitting angle and a light-receiving angle also change.

As an element retention member in the present invention, a cup-shaped member formed by processing, such as drawing, a part of a tabular metal plate (hoop material) into a cup shape or a thick plate member using a part formed by thickening a part of an odd-shaped material as a heat sink is named. However, since an odd-shaped material is manufactured by shaving a part of a thick plate in many cases, a drawback thereof is that a brim part is hardly processed. Consequently, a cup-shaped member formed into a cup shape by drawing a part of a tabular metal plate (hoop material) has a high applicability, is a low cost, and is excellent in mass production.

In the present invention, on a boundary plane between an element retention member and an insulative partition part, a creeping route ranging from a top face to retain a semiconductor element to a package bottom face includes a bent route having a plurality of turns, hence the length of the creeping route from the top face to the bottom face increases and the number of turns also increases, and the exudation of a liquid encapsulation resin from the top face to the bottom face is hindered well. As a bent route having plural turns in the present invention, a bent route a part of which comprises an overlap part extending inside the periphery of an element retention member so as to cover a boundary plane with the element retention member from the insulative partition part on the top face is named for example. Otherwise, a bent route including a partial route bent stepwise, a groove-like partial route formed at the periphery of an element retention member so as to intercept a creeping route ranging from the top face to retain a semiconductor element to a package bottom face, or a U-shaped partial route may also be adopted for example.

Specifically, the thickness of an overlap part from the periphery of an element retention member and the length of a part extending inside the periphery of an element retention member may be determined in accordance with the size of an LED device. Here, it goes without saying that an overlap part may be formed more easily as the thickness increases and the exudation of an encapsulation resin may be hindered better as the length increases.

A U-shaped partial route wrapping around the periphery of an element retention member is formed by forming an overlap part so as to cover a boundary plane with the element retention member from an insulative partition part. Consequently, only by forming a recess acting as an overlap part in a die for manufacturing a package, mass production comes to be possible and an encapsulation resin is inhibited from exuding toward the bottom face side of the package.

As another partial route, a partial route comprising a bent part around an element retention member in a bent route in a package is named. A U-shaped partial route wrapping around a bent part is formed by the bent part around an element retention member. Consequently, it is possible to inhibit a liquid encapsulation resin from exuding toward the bottom face side of a package. Further, another advantage is that the strength of an element retention member increases by a bent part. By the increase of the strength, mechanical stability between an element retention member and a resin improves, a gap is hardly formed between them, and the prevention of the exudation of an encapsulation resin and the prevention of the intrusion of flux and a solvent improve further. Further, it is a matter of course that the increase in the strength of an element retention member causes the effect of also increasing the strength of a package itself.

Further, as another preferred embodiment, the case of forming a bent route in a package with a notched part at the brim part of an element retention member is named. A specific notched part may be formed at the periphery of an element retention member so as to intercept a creeping route ranging from a top face to retain a semiconductor element to a package bottom face. By a notched part at the brim part of an element retention member, a liquid encapsulation resin can hardly move in the exuding direction and hence it is possible to inhibit the liquid encapsulation resin from exuding toward the bottom face side of a package. Further, by a notched part, mechanical stability between an element retention member and an insulative resin improves, a gap is hardly formed between them, the prevention of the exudation of an encapsulation resin and the prevention of the intrusion of flux and a solvent improve further. Further, it is a matter of course that the increase in the strength between an element retention member and an insulative resin causes the effect of also increasing the strength of a package itself.

Here, the width and the depth of a notched part vary in accordance with the physical properties of an element retention member and an insulative resin to be used. At least however, the width and the groove depth are selected so as to: extend the length of a creeping route ranging from a top face to a package bottom face by the intrusion of an insulative resin into a notch groove; and certainly inhibit movement parallel with the periphery of an element retention member by the insulative resin intruding into the notch groove. A notched part may be formed by press working, laser processing, or the like and can be formed most easily by the press working and the press working is suitable for mass production. Further, as a cross-sectional shape, a V-shape, a U-shape, a concave shape, or the like is selected but, if press working is adopted, a V-shape or a U-shape is formed easily.

Further, as another preferred embodiment, the case of forming a bent route in a package by a stepped part at the brim part of an element retention member is named. By a stepped part around an element retention member, the direction of the exudation of a liquid encapsulation resin has to be bent nearly at a right angle and hence it is possible to inhibit the liquid encapsulation resin from exuding toward the bottom face side of a package. Further, another advantage is that the strength of an element retention member increases by a stepped part. By the increase of the strength, mechanical stability between an element retention member and a resin improves, a gap is hardly formed between them, and the prevention of the exudation of an encapsulation resin and the prevention of the intrusion of flux and a solvent improve further. Further, it is a matter of course that the increase in the strength of an element retention member causes the effect of also increasing the strength of a package itself.

It is a matter of course that, with regard to the number of bent routes at a bent part and a stepped part, the exudation of an encapsulation resin is hindered well in accordance with the number of the bent routes. Preferably, by a creeping route including a bent route having three turns or more, not only the length of the creeping route ranging from a top face to a bottom face increases and the number of turns also increases but also the strength improves and the adhesiveness with an insulative resin improves. For example, since the case of including a U-shaped bent part or a stepped part bent nearly at a right angle in the route ranging from a top face to a bottom face is well in strength and it is structured so that an insulative resin may interpose an element retention member from both sides, the adhesiveness with the resin improves and the structure is stabilized.

A stepped part formed at the brim part of an element retention member can be formed by various working technologies and is preferably formed by coining by press. With regard to the coining, it is possible to: use a hoop material; apply coining before and after the processes when the element retention member and a lead part are formed continuously; and thus form the stepped part continuously.

Here, in a semiconductor package according to the present invention, it is not hindered to simultaneously form an overlap part extending inside the periphery of a cup-shaped member so as to cover a boundary plane with the cup-shaped member from an insulative partition part and a bent part formed around the cup-shaped member. Further, in a semiconductor package according to the present invention, it is not hindered to devise a lead part so as to bend a route ranging from a top face to a bottom face.

As more specific examples, FIG. 1 comprises sectional views showing specific examples of a bent route in a creeping route of a semiconductor package according to the present invention having a cup-shaped element retention member and FIG. 2 comprises sectional views showing specific examples of a bent route in a creeping route of a semiconductor package according to the present invention having an element retention member comprising an odd-shaped material having a thickness heavier than the thickness of a lead part. In the figures, FIGS. 1A and 2A represent the cases of overlap parts, FIGS. 1B and 2B the cases of notched parts, FIGS. 1O, 1D, 2C, and 2D bent parts, and FIGS. 1E, 1F, 2E, and 2F stepped parts.

Figure 2A:
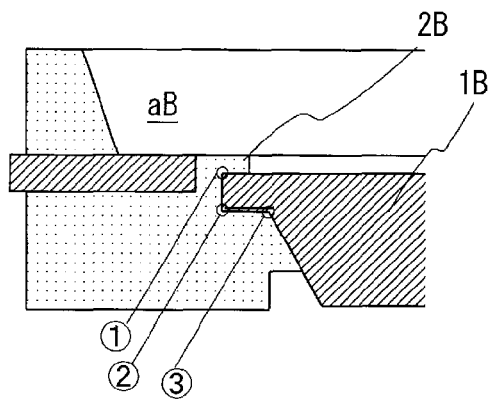
FIG. 2A represents the case of an overlap part, FIG. 2B the case of a notched part, FIGS. 2C and 2D bent parts, and FIGS. 2E and 2F stepped parts.

As shown in FIGS. 1A and 2A, although the element retention members are different from each other in whether each of them is a cup-shaped member 1A or a thick plate member 1B, in a creeping route ranging from a top face to retain a semiconductor element to a package bottom face in a package aA or aB, one of bent routes is formed with an overlap part 2A or 2B extending inside the periphery of the element retention member so as to cover a boundary plane with the element retention member from an insulative partition part on the top face. Consequently, the bent route in each of FIGS. 1A and 2A includes a bent route having three turns as shown in each of the figures.

Figure 1B:
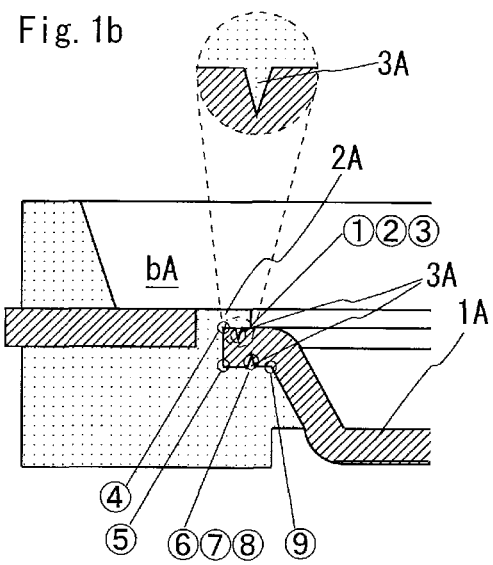
FIG. 1 comprises sectional views showing specific examples of a bent route in a creeping route of a semiconductor package according to the present invention having a cup-shaped element retention member.
Figure 1C:
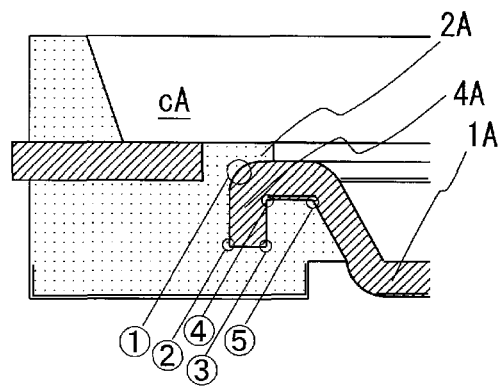
Figure 1D:
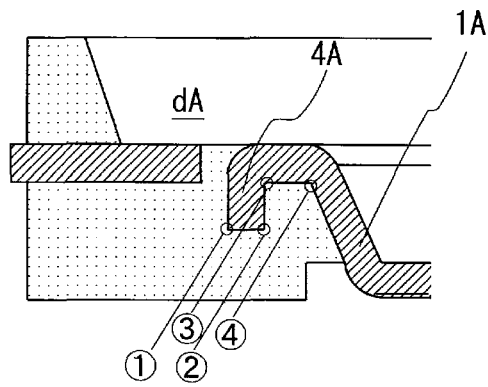
Figure 1E:
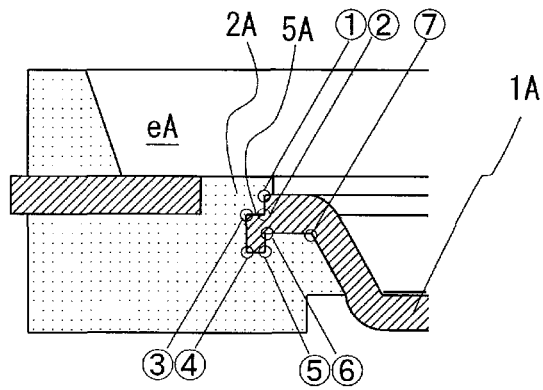
Figure 1F:
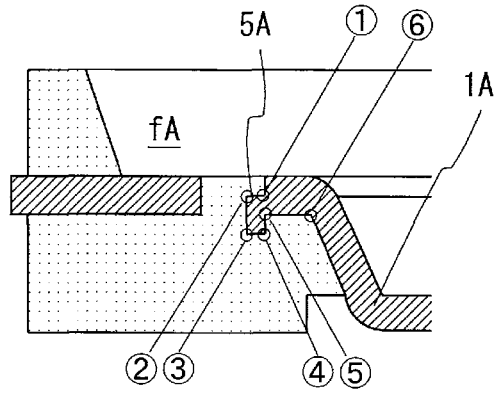
Figure 2B:
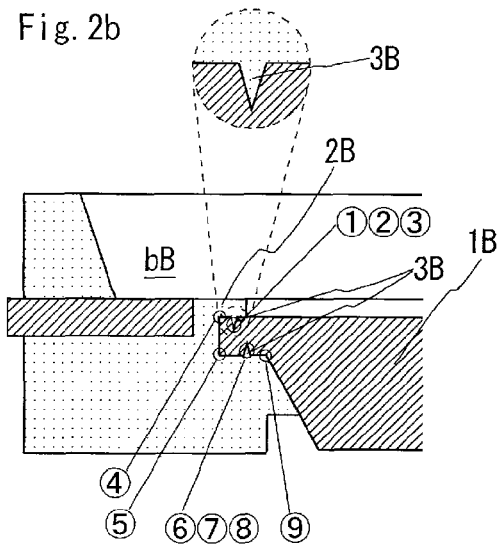
FIG. 2 comprises sectional views showing specific examples of a bent route in a creeping route of a semiconductor package according to the present invention having an element retention member comprising an odd-shaped material having a thickness heavier than the thickness of a lead part.
Figure 2C:
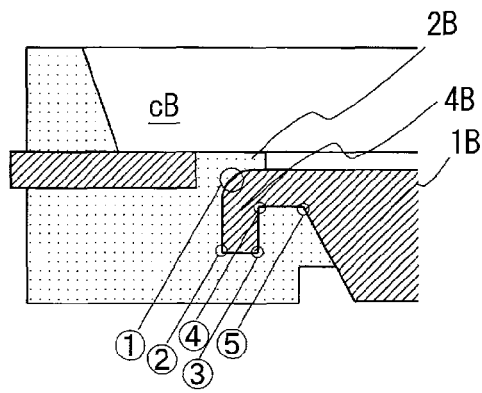
Figure 2D:
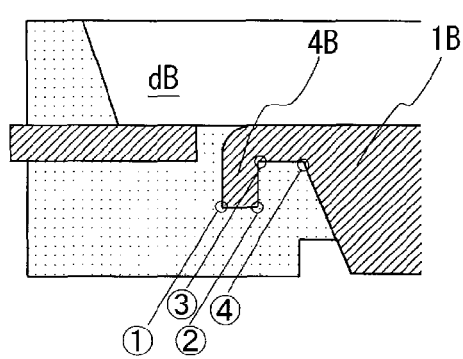
Figure 2E:
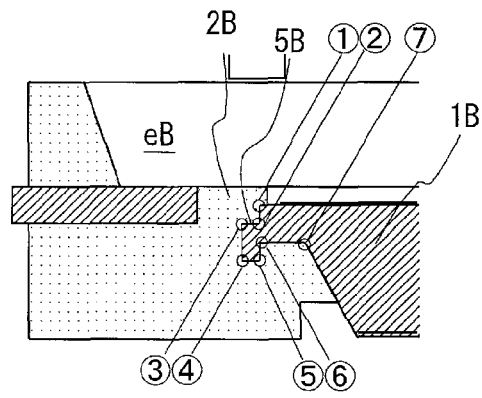
Figure 2F:
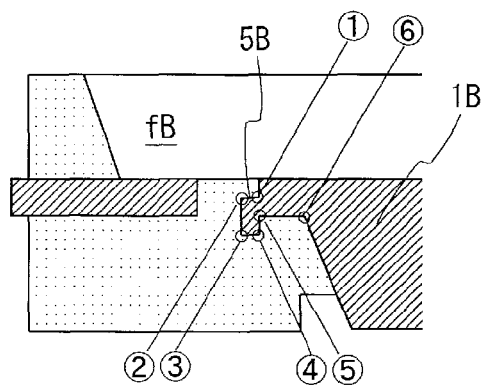

As shown in FIGS. 1B and 2B, although the element retention members are different from each other in whether each of them is a cup-shaped member 1A or a thick plate member 1B, in a creeping route ranging from a top face to retain a semiconductor element to a package bottom face in a package bA or bB, one of bent routes is formed with an overlap part 2A or 2B extending inside the periphery of the element retention member so as to cover the boundary plane with the element retention member from an insulative partition part on the top face and notched parts 3A or 3B of V-shaped grooves are formed at two sites on both the top and bottom faces at the brim part of the element retention member. The notched parts 3A or 3B on both the top and bottom faces are cut not at opposing sites but at sites deviating from each other. The notched parts 3A or 3B have a cross-sectional shape of a V-shape and hence the bent route in each of FIGS. 1B and 2B includes a bent route having nine turns as shown in each of the figures.

As shown in FIGS. 1C, 2C, 1D, and 2D, although the element retention members in packages cA, dA, cB, and dB are different from each other in whether each of them is a cup-shaped member 1A or a thick plate member 1B, a bent part 4A or 4B is formed at the brim part of each of the element retention members. Then the difference between FIGS. 1O and 2C and FIGS. 1D and 2D is whether an overlap part 2A or 2B similar to one shown in FIGS. 1A and 2A is formed. In this way, a creeping route ranging from a top face to retain a semiconductor element to a package bottom face includes a bent route having five turns in FIGS. 1C and 2C and a bent route having four turns in FIGS. 1D and 2D.

As shown in FIGS. 1E, 2E, 1F, and 2F, although the element retention members in packages eA, fA, eB, and fB are different from each other in whether each of them is a cup-shaped member 1A or a thick plate member 1B, a stepped part 5A or 5B is formed at the brim part of each of the element retention members. Then the difference between FIGS. 1E and 2E and FIGS. 1F and 2F is whether an overlap part 2A or 2B similar to one shown in FIGS. 1A and 2A is formed. In this way, a creeping route ranging from a top face to retain a semiconductor element to a package bottom face includes a bent route having seven turns in FIGS. 1E and 2E and a bent route having six turns in FIGS. 1F and 2F.

EXAMPLES

Example 1

Overlap Part Formed Package

FIG. 3 comprises explanatory views showing a configuration of an example of a semiconductor package according to the present invention; FIG. 3A is a plan view, FIG. 3B a side view, FIG. 3C a sectional view taken on line A-A, FIG. 3D a front view, FIG. 3E a sectional view taken on line B-B, FIG. 3F a rear view, and FIG. 3G a perspective view.

A package 20 according to the present example is used for an LED device having an element retention space 23 configured with an element retention region 21 to retain an LED element and a frame member 22 surrounding the circumference of the element retention region 21 sealed with an optically transparent resin. Specifically, in an element retention region 21, a lead part 24 electrically coupled to an LED element (not shown in the figures) and a cup-shaped member 26 bringing the LED element into thermally conductive contact with a top face appear through an insulative partition part 25 comprising an insulative resin.

A lead part 24 and a cup-shaped member 26 are formed from a metal plate 0.2 mm in thickness by continuous punching as shown in the figures. The rectangular cup-shaped member 26 comprises one sheet and the lead part 24 comprises six sheets in total, each three sheets being disposed oppositely with the cup-shaped member 26 interposed in between.

A package 20 according to the present example is used for an LED device having an element retention space 23 configured with an element retention region 21 to retain at least one LED element (not shown in the figures) and a frame member 22 surrounding the circumference of the element retention region 21 sealed with an optically transparent resin. In a cup-shaped member 26, a bottom plate part 27 thermally conductively touching an LED element and a rising brim part 28 surrounding the circumference of the bottom plate part 27 are formed by drawing.

A rising brim part 28 is formed circularly around the whole periphery of a bottom plate part 27 and a horizontal brim part 29 is formed at the outer brim part of the rising brim part 28. Meanwhile, on the bottom face of an element retention region 21, the bottom face of the bottom plate part 27 of a cup-shaped member 26 appears on a plane identical to the bottom face of an insulative partition part 25 comprising an insulative resin.

In a package 20 according to the present example, as shown in the enlarged view of FIG. 3C, an overlap part 30 comprising an insulative resin extending inside the periphery of a cup-shaped member 26 so as to cover a boundary plane with the cup-shaped member 26 from an insulative partition part 25 is formed over a horizontal brim part 29. A U-shaped partial route is formed along a boundary plane between a metallic cup-shaped member 26 and an insulative partition part 25 comprising an insulative resin by the overlap part 30 and, even when an element retention space 23 is sealed with an optically transparent resin, the exudation of the optically transparent resin ranging from a top face to a bottom face is hindered well.

Here, a package 20 comes to be an LED device by mounting three LED elements on one cup-shaped member 26, electrically coupling electrodes of each LED element to a lead part 24 with wires, sealing an element retention space 23 with an optically transparent resin, and after or before that being separated from a metal plate.

Example 2

Bent Part Formed Package

FIG. 4 comprises explanatory views showing a configuration of another example of a semiconductor package according to the present invention; FIG. 4A is a plan view, FIG. 4B a side view, FIG. 4C a sectional view taken on line A-A, FIG. 4D a front view, FIG. 4E a sectional view taken on line B-B, FIG. 4F a rear view, and FIG. 4G a perspective view.

A package 40 according to another example is, in the same way as Example 1, used for an LED device having an element retention space 43 configured with an element retention region 41 to retain an LED element and a frame member 42 surrounding the circumference of the element retention region 41 sealed with an optically transparent resin. Specifically, in an element retention region 41, a lead part 44 electrically coupled to an LED element (not shown in the figures) and a cup-shaped member 46 bringing the LED element into thermally conductive contact with a top face appear through an insulative partition part 45 comprising an insulative resin.

A lead part 44 and a cup-shaped member 46 are formed from a metal plate 0.2 mm in thickness by continuous punching as shown in the figures. The rectangular cup-shaped member 46 comprises one sheet and the lead part 44 comprises six sheets in total, each three sheets being disposed oppositely with the cup-shaped member 46 interposed in between.

A package 40 according to the present example is used for an LED device having an element retention space 43 configured with an element retention region 41 to retain at least one LED element (not shown in the figures) and a frame member 42 surrounding the circumference of the element retention region 41 sealed with an optically transparent resin. In a cup-shaped member 46, a bottom plate part 47 thermally conductively touching an LED element and a rising brim part 48 surrounding the circumference of the bottom plate part 47 are formed by drawing.

A rising brim part 48 is formed circularly around the whole periphery of a bottom plate part 47 and a horizontal brim part 49 is formed at the outer brim part of the rising brim part 48. Meanwhile, on the bottom face of an element retention region 41, the bottom face of the bottom plate part 47 of a cup-shaped member 46 appears on a plane identical to the bottom face of an insulative partition part 45 comprising an insulative resin.

In a package 40 according to the present example, as shown in the enlarged view of FIG. 4C, an overlap part 50 comprising an insulative resin extending inside the periphery of a cup-shaped member 46 so as to cover a boundary plane with the cup-shaped member 46 from an insulative partition part 45 is formed and further a bent part 51 is formed by bending downward the outer brim of the horizontal brim part 49 of the cup-shaped member 46. A U-shaped partial route is formed along a boundary plane between a metallic cup-shaped member 46 and an insulative partition part 45 comprising an insulative resin by the overlap part 50 and the bent part 51 and, even when an element retention space 43 is sealed with an optically transparent resin, the exudation of the optically transparent resin ranging from a top face to a bottom face is hindered well.

Here, although the case of forming an overlap part 50 and a bent part 51 is disclosed in the present example, even in the case of forming only a bent part 51, even when an element retention space 43 is sealed with an optically transparent resin, the exudation of the optically transparent resin ranging from a top face to a bottom face is hindered well.

Further, on the bottom face of an element retention region 41, the bottom face of a bottom plate part 47 of a cup-shaped member 46 appears on a plane identical to the bottom face of an insulative partition part 45 comprising an insulative resin. Here, a package 40 comes to be an LED device by mounting three LED elements on one cup-shaped member 46, electrically coupling electrodes of each LED element to a lead part 44 with wires, sealing an element retention space 43 with an optically transparent resin, and after or before that being separated from a metal plate.

Example 3

Press Formed Package

Figure 6A:
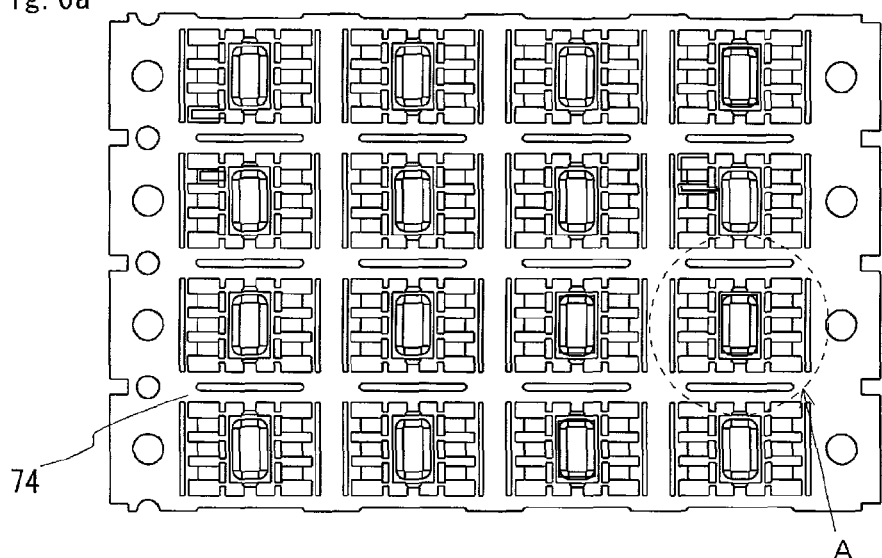
FIG. 6A is a plan view of a hoop material over which lead frames are disposed in parallel, FIG. 6B a plan view of a lead frame separated from the hoop material and shown in A, FIG. 6C a sectional view taken on line B-B and a partially enlarged view thereof, and FIG. 6D a sectional view taken on line C-C and a partially enlarged view thereof.
Figure 6B:
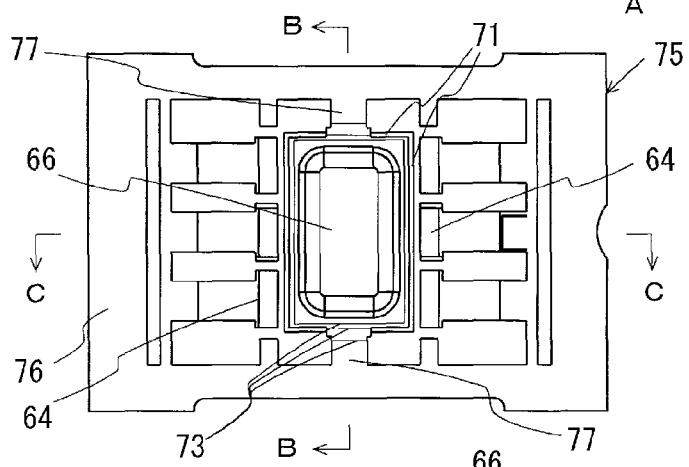
FIG. 6 comprises explanatory views of a lead frame showing a configuration of a metallic member in FIG. 5.
Figure 6C:
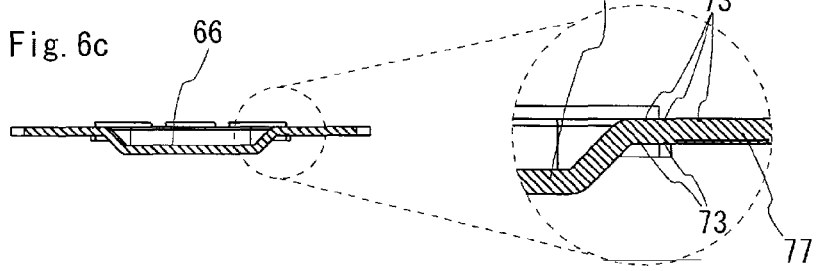
Figure 6D:
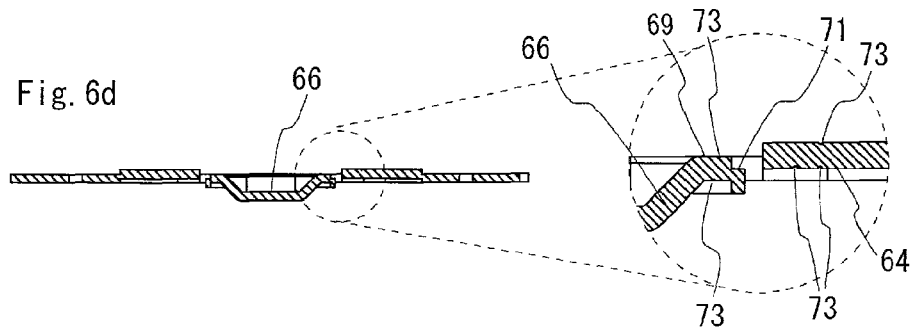

FIG. 5 comprises explanatory views showing a configuration of yet another example of a semiconductor package according to the present invention; FIG. 5A is a plan view, FIG. 5B a side view, FIG. 5C a sectional view taken on line B-B and a partially enlarged view thereof, FIG. 5D a front view, FIG. 5E a sectional view taken on line A-A and a partially enlarged view thereof, and FIG. 5F a bottom view. FIG. 6 comprises explanatory views of a lead frame showing a configuration of a metallic member in FIG. 5; FIG. 6A is a plan view of a hoop material over which lead frames are disposed in parallel, FIG. 6B a plan view of a lead frame separated from the hoop material and shown in A, FIG. 6C a sectional view taken on line B-B and a partially enlarged view thereof, and FIG. 6D a sectional view taken on line C-C and a partially enlarged view thereof.

As shown in FIG. 5, a package 60 according to yet another example is, in the same way as Examples 1 and 2, used for an LED device having an element retention space 63 configured with an element retention region 61 to retain an LED element and a frame member 62 surrounding the circumference of the element retention region 61 sealed with an optically transparent resin. Specifically, in an element retention region 61, a lead part 64 electrically coupled to an LED element (not shown in the figures) and a cup-shaped member 66 bringing the LED element into thermally conductive contact with a top face appear through an insulative partition part 65 comprising an insulative resin.

A lead part 64 and a cup-shaped member 66 are formed from a metal plate 0.2 mm in thickness by continuous punching as shown in the figures. The rectangular cup-shaped member 66 comprises one sheet and the lead part 64 comprises six sheets in total disposed oppositely with the cup-shaped member 66 interposed in between.

A package 60 according to the present example is used for an LED device having an element retention space 63 configured with an element retention region 61 to retain at least one LED element (not shown in the figures) and a frame member 62 surrounding the circumference of the element retention region 61 sealed with an optically transparent resin. In a cup-shaped member 66, a bottom plate part 67 thermally conductively touching an LED element and a rising brim part 68 surrounding the circumference of the bottom plate part 67 are formed by drawing.

A rising brim part 68 is formed circularly around the whole periphery of a bottom plate part 67 and a horizontal brim part 69 is formed at the outer brim part of the rising brim part 68. Meanwhile, on the bottom face of an element retention region 61, the bottom face of the bottom plate part 67 of a cup-shaped member 66 appears on a plane identical to the bottom face of an insulative partition part 65 comprising an insulative resin.

In a package 60 according to the present example, as specifically shown in the enlarged views of FIGS. 5C and 5E, a stepped part 71 is formed so that the periphery of a cup-shaped member 66 may deviate from an insulative partition part 65 in the thickness direction. The stepped part 71 can be processed by various processing technologies but is formed by coining for pressing the periphery of a cup-shaped member 66 with a pair of upper and lower dies having concavity and convexity. The stepped part 71 is formed around the cup-shaped member 66 other than two connecting pieces 77 connected to a hoop frame material 76 (FIG. 6). By the stepped part 71, a bent route having seven turns is formed at a boundary plane between a metallic cup-shaped member 66 and an insulative partition part 65 comprising an insulative resin. Even when an element retention space 63 is sealed with an optically transparent resin, the exudation of the optically transparent resin ranging from a top face to a bottom face is hindered well. Further, notched parts 73 are press-formed inside the stepped part 71 of a cup-shaped member 66, on the top and bottom faces of the connecting pieces 77, and on the top and bottom faces of a lead part and thereby too the mechanical stability between a cup-shaped member 66 and an insulative resin improves further.

As shown in FIG. 6, with regard to a stepped part 71, it is possible to continuously manufacture a continuum of lead frames 75 into a hoop material 74 by press working, such as cutting, drawing, and bending, the hoop material 74 into lead parts 64 and cup-shaped members 66. It is possible to form a stepped part 71 in sequence at the circumference of a cup-shaped member 66 other than a connecting piece 77 connecting with a hoop frame material 76 by applying coining as a part of the pressing processes and that suits for massive production. Further, another advantage is that a stepped part 71 and a notched part 73 improve adhesiveness with a resin when a cup-shaped member 66 receiving a semiconductor element and having a heat sink function is integrated with the resin.

Further, on the bottom face of an element retention region 61, the bottom face of the bottom plate part 67 of a cup-shaped part 66 appears on a plane identical to the bottom face of an insulative partition part 65 comprising an insulative resin. Here, a package 60 comes to be an LED device by mounting at least one LED element on one cup-shaped member 66, electrically coupling electrodes of each LED element to six lead parts 64 with wires, sealing an element retention space 63 with an optically transparent resin, and after or before that being separated from a metal plate.

Example 4

Penetration Test

FIGS. 7 and 8 comprise explanatory views schematically showing the results of permeation test with a semiconductor package shown in FIG. 3. That is, penetration test is applied to a semiconductor package according to Example 1 and the appearance on the bottom face side is observed. FIGS. 7 and 8 show the temporal changes on package bottom face sides of a semiconductor package (A) having a bent route of two turns where an overlap part 30 is not formed and a semiconductor package (B) having a bent route of three turns where an overlap part 30 is formed.

Specifically, FIG. 7A shows the state immediately after the start, FIG. 7B the state after 10 sec., FIG. 7C after 1 min., FIG. 8D after 10 min., FIG. 8E after 20 min., and FIG. 8F after 60 min. Here, difference between the package (A) and the package (B) is only whether or not an overlap part 30 is formed.

As shown in FIGS. 7 and 8, with regard to the state on the bottom face side after the lapse of time after dripping a penetrant (red checker) in an element retention space 23, in the case of the package (A), it is confirmed that a penetrant 81 exudes from the boundary part between a cup-shaped member 26 at the left on the bottom face and an insulative partition part 25 comprising an insulative resin after 10 sec. after the penetrant is injected and the exudation increases with the lapse of time.

On the other hand, in the case of the package (B), although the insulative partition part 25 itself turns red slightly at the boundary region 82 of the cup-shaped member 26 after 60 min. after the penetrant is injected, even in such a situation, it is not confirmed that the penetrant exudes from the boundary part between the cup-shaped member 26 and the insulative partition part 25 comprising an insulative resin on the bottom face side.

Here, although the cases of a bent route of two turns and a bent route of three turns are compared in the penetration test of the present example, in the case of another bent route of more than three turns, the effect of inhibiting an encapsulation resin from exuding toward the bottom face side of a package is more conspicuous than the present example.

INDUSTRIAL APPLICABILITY

Since it is possible to inhibit a liquid encapsulation resin from exuding from an element retention space toward a bottom face side before solidification, in a package not only influencing the appearance of a product but also exhibiting heat dissipation effect in particular, it is possible to inhibit a liquid encapsulation resin from exuding toward a package bottom face side and secure heat dissipation effect.

EXPLANATION OF REFERENCE CORDS aA, bA, cA, dA, eA, fA: Package
aB, bB, cB, dB, eB, fB: Package
1A: Cup-shaped member (element retention member)
1B: Thick plate member (element retention member)
2A, 2B: Overlap part
3A, 3B: Notched part
4A, 4B: Bent part
5A, 5B: Stepped part
20, 40, 60: Package
21, 41, 61: Element retention region
22, 42, 62: Frame member
23, 43, 63: Element retention space
24, 44, 64: Lead part
25, 45, 65: Insulative partition part
26, 46, 66: Cup-shaped member (element retention member)
27, 47, 67: Bottom plate part
28, 48, 68: Rising brim part
29, 49, 69: Horizontal brim part
30, 50: Overlap part
51: Bent part
71: Stepped part
73: Notched part
74: Hoop material
75: Lead frame
76: Hoop frame material
77: Connecting piece
81: Penetrant
82: Boundary region

The invention claimed is:

1. A semiconductor package: said package having a semiconductor element retention plane including a region for retaining a semiconductor element and a frame member surrounding the circumference of said semiconductor element retention plane and being used for configuring a semiconductor device formed by sealing an element retention space formed with said semiconductor element retention plane and said frame member with an optically transparent resin or an optically nontransparent resin; and a lead part electrically coupled to said semiconductor element by wire bonding, an element retention member to retain said semiconductor element on the top face side and radiate heat from said semiconductor element on the bottom face side, and an insulative partition part to partition said lead part from said element retention member with an insulative resin appearing on said semiconductor element retention plane, wherein a creeping route ranging from the top face to retain said semiconductor element to the package bottom face on a boundary plane between said element retention member and said insulative partition part includes a bent route having three or more turns, wherein said bent route is formed with an overlap part extending inside the periphery of said element retention member so as to cover the boundary plane with said element retention member from said insulative partition part on the top face.

2. A semiconductor package according to claim 1, wherein said bent route is formed with a bent part at the brim part of said element retention member.

3. A semiconductor package according to claim 1, wherein said bent route is formed with a notched part at the brim part of said element retention member.

4. A semiconductor package according to claim 1, wherein said bent route is formed with a stepped part at the brim part of said element retention member.

5. A semiconductor package according to claim 4, wherein said stepped part is formed by coining said element retention member by press.

6. A semiconductor package according to claim 1, wherein said semiconductor element is an element selected from the group of a light emitting diode, a light intensity sensor, a CMOS image sensor, and a CCD image sensor.

* * * * *